US006457168B1

(12) United States Patent
Jakobs

(10) Patent No.: US 6,457,168 B1
(45) Date of Patent: Sep. 24, 2002

(54) METHOD FOR PRODUCING STRUCTURES ON THE SURFACE OF A SEMICONDUCTOR WAFER

(75) Inventor: Andreas Jakobs, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/492,655

(22) Filed: Jan. 27, 2000

(30) Foreign Application Priority Data

Jan. 27, 1999 (DE) .......................................... 199 03 200

(51) Int. Cl.⁷ .............................................. G06F 17/50
(52) U.S. Cl. ............................... 716/19; 716/20; 716/21
(58) Field of Search ....................... 716/1–21; 327/553; 430/5, 311, 313; 702/57; 703/13, 14, 19; 714/738

(56) References Cited

U.S. PATENT DOCUMENTS 5,849,440 A * 12/1998 Lucas et al. .................... 430/5
6,237,126 B1 * 5/2001 Bonitz ............................. 716/4

FOREIGN PATENT DOCUMENTS

EP 0599469 A2 6/1994

OTHER PUBLICATIONS

"Lithography Computer Aided Design Technology for Embedded Memory in Logic", Ohnuma et al., Jpn. J. Appl. Phys., vol. 37, 1998, pp. 6686–6688.

* cited by examiner

Primary Examiner—Matthew Smith
Assistant Examiner—Naum Levin
(74) Attorney, Agent, or Firm—Laurence A. Greenberg; Werner H. Stemer; Ralph E. Locher

(57) ABSTRACT

The invention relates to a method for producing structures on the surface of a semiconductor wafer, in which after the generation of a primary layout corresponding to the structures to be produced in accordance with predetermined desired physical parameters of the structures, calculation of the parasitic fault parameters that would result from the semiconductor structures after production using the primary layout, correction of the layout to suit the results of the step of calculating the parasitic fault parameters, and production of a mask based on the layout that has been corrected to suit the parasitic fault parameters, the surface of a semiconductor wafer is structured using an etching process. The structuring process leads to production- or technology-dictated deviations from the shapes that are produced on the mask based on the corrected layout, and the primary layout is corrected on the basis of the production- or technology-dictated deviations of the structures.

4 Claims, 1 Drawing Sheet

METHOD FOR PRODUCING STRUCTURES ON THE SURFACE OF A SEMICONDUCTOR WAFER

BACKGROUND OF THE INVENTION

Field of the Invention

The invention lies in the semiconductor technology field. More specifically, the invention relates to a method for producing structures on the surface of a semiconductor wafer. The method, as generically defined, includes the following production steps:

a primary layout, corresponding to the structures to be produced, is first designed in accordance with predetermined desired physical parameters of the structures;

the parasitic fault parameters are calculated that would result from the semiconductor structures after production using the primary layout;

the layout is corrected in accordance with the results of the parasitic fault parameter calculation;

a mask is produced based on the layout corrected in accordance with the parasitic fault parameters; and the surface of the semiconductor wafer is structured using an etching process. The structuring is subject to production-dictated or technology-dictated deviations from the shapes that are produced on the mask based on the corrected layout.

Modern integrated circuits are being produced with ever-smaller structures and are intended to be operated at ever-higher clock speeds. This makes it an absolute precondition that the structures to be formed on the semiconductor chip, which form the integrated circuit, be calculated with very high precision. Even lines or structures extending alongside one another cause parasitic impedances, which can affect or even change the physical properties, and thus the switching performance, of the integrated circuit. If production dictated differences occur between the primary layouts generated on a CAD system and the integrated circuit made from a mask based on the primary layout, they can require cost-intensive readjustments to the layout or can cause delays in the production of a new product, which hurts sales. In the fast-moving semiconductor market, both of these factors must absolutely be prevented.

It is therefore of considerable significance that even before production begins, parasitic resistances and capacitances of the structures on the chip that alter or may alter the properties of the circuits be detected as precisely as possible and thus taken into account through calculations. By simulation, modification and reproduction of the layout, an attempt is made to approach the maximum capacity of current technology as well as possible. This a priori detection is obtained by extracting the parasitic impedances from the layout. This can be done with appropriate CAD tools. Exemplary such tools are available in the commercially available software packages known as DIVA®, DRACULA®, or VAMPIRE®, among the range of products available from Cadence Design Systems, Inc. or Santa Clara, Calif. With that software, an extraction of parasitic impedances can be performed in each case. In an existing CAD layout, using VAMPIRE® software, a so-called design rules check (DRC) is performed, followed by so-called parasitic extraction (RCX). The CAD layout is then corrected (changes in the location or widths of tracks or structures) on the basis of the outcomes of the parasitic extraction.

Technologically, the increasing miniaturization of the structures on the semiconductor wafer now leads not only to an increase in parasitic effects, but also to increasing deviations in the actual structures on the semiconductor material from the structures in the layout that have been generated according to the mask. In that process, proximity effects occur that come under the heading of "optical proximity effects." The term, as it is used by those of skill in this art, does not properly encompass the many nonlinearities that occur in transferring the structures. This is so because not only the nearness of the structures but even more the dimensions of the individual structures themselves, and the position of the adjacent structures to one another, also play a role. The error in duplication from the mask is then no longer determined solely by the substrate and the etching technique, in which the conventional problems of underetching, for instance, also continue to play a role, but also by the lithographical technique employed itself. Such parameters as the aperture number, the type of exposure light used and its wavelength, and the dimension and nature of the structures of the mask, such as their thickness, are also very important.

It is thus found that, because of the increasing influence of technology in the production of structures on the semiconductor wafer, the parasitic elements are no longer detected correctly, since the actual structures deviate sharply from those in the primary layout. Thus even the correction with regard to the parasitic elements calculated from the primary layout can no longer yield correct results.

SUMMARY OF THE INVENTION

The object of the invention is to provide a method of producing structures on the surface of a semiconductor wafer, which overcomes the above-noted deficiencies and disadvantages of the prior art devices and methods of this kind, and which allows the inclusion of the technologically dictated properties of the production of structures on the semiconductor wafer in the design calculation, and thus leads to more-precise layouts for actual production.

With the above and other objects in view there is provided, in accordance with the invention, a method for producing structures on a surface of a semiconductor wafer, which comprises:

generating a primary layout of structures to be produced on a surface of a semiconductor wafer, in accordance with predetermined desired physical parameters of the structures;

calculating parasitic fault parameters that would result from the semiconductor structures after a production thereof in accordance with the primary layout;

correcting the primary layout in accordance with a result obtained in the step of calculating the parasitic fault parameters, and further correcting the primary layout based on production- or technology-dictated deviations to be expected in a following structuring step;

producing a mask based on the layout corrected in accordance with the parasitic fault parameters; and structuring the surface of the semiconductor wafer in an etching process subject to the production- or technology-dictated deviations from the shapes produced on the mask based on the primary layout.

In other words, the invention is characterized in that the primary layout is corrected on the basis of the production- or technology-dictated deviations of the structures.

The invention proposes that the technology- and production dictated factors that are the cause for the deviation in the shapes and dimensions of the structures on the semiconductor wafer be undertaken before the parasitic fault parameters, with regard to which a layout correction-is made, are calculated. That is, before the parasitic elements are calculated, the primary layout is corrected on the basis of the technology-dictated deviations; the parasitic elements are then determined, and the layout is corrected on the basis of the outcome of this determination. The etching mask is generated based on this corrected layout.

In accordance with an added feature of the invention, the correcting step comprises correcting the layout for the production- or technology-dictated deviations of the structures after the structuring process, with regard to parasitic fault parameters of conductor tracks and the structures on the semiconductor wafer. In this preferred aspect of the invention, the layout, after the corrections corresponding to the production- or technology-dictated deviations of the structures, after the structuring method, is corrected with regard to parasitic fault parameters of the conductor tracks and structures on the semiconductor wafer. This partial aspect of the invention proposes correcting the primary layout with regard to the technological factors first, and then correcting it with regard to the parasitic fault parameters. This has the advantage over a correction with regard to the technological factors only after a correction with respect to the parasitic fault parameters is made is that it can be much better integrated into existing procedures.

In accordance with an additional feature of the invention, the parasitic fault parameters are parasitic impedances formed by a shape and a relative position of the structures on the semiconductor material.

In accordance with another feature of the invention, the production- or technology-dictated deviations of the structures are defined as deviations due to effects such as proximity effects of the conductor tracks, changes in shape in structural dimensions dictated by etching factors, optical effects, including those due to resolution effects from proximity and miniaturization of the structures and effects of exposure to light.

Other features which are considered as characteristic for the invention are set forth in the appended claims.

Although the invention is illustrated and described herein as embodied in method for producing structures on the surface of a semiconductor wafer, it is nevertheless not intended to be limited to the details shown, since various modifications and structural changes may be made therein without departing from the spirit of the invention and within the scope and range of equivalents of the claims.

The construction and method of operation of the invention, however, together with additional object s and advantages thereof will be best understood from the following description of specific embodiments when read in connection with the accompanying drawings.

DESCRIPTION OF THE PREFERRED EMBODIMENTS

Figure 1:
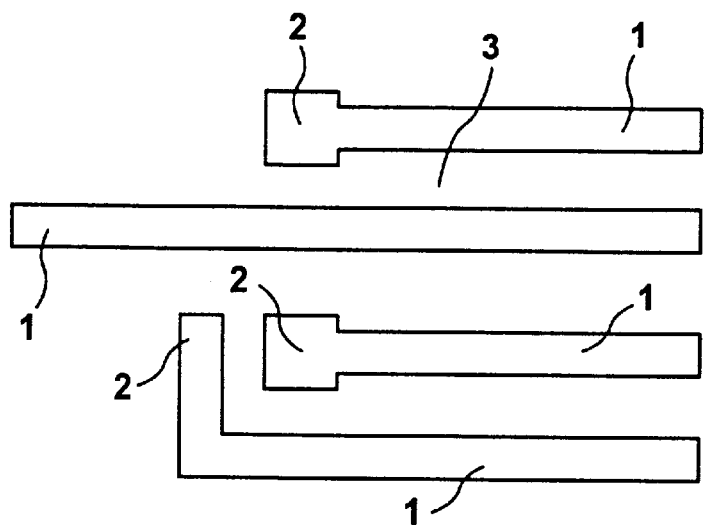
FIG. 1 is a plan view of a typical structure of the kind found in a primary layout and in a corresponding etching mask.

FIG. 1 is a plan view of a typical structure in a primary layout, which is to be made on the surface of a semiconductor wafer, using an etching process and a mask made from the layout and used for the purpose. The exemplary layout illustration includes conductor tracks 1 and terminal structures or electrodes 2. The non-structure areas of the surface of the substrate are identified at 3.

Figure 2:
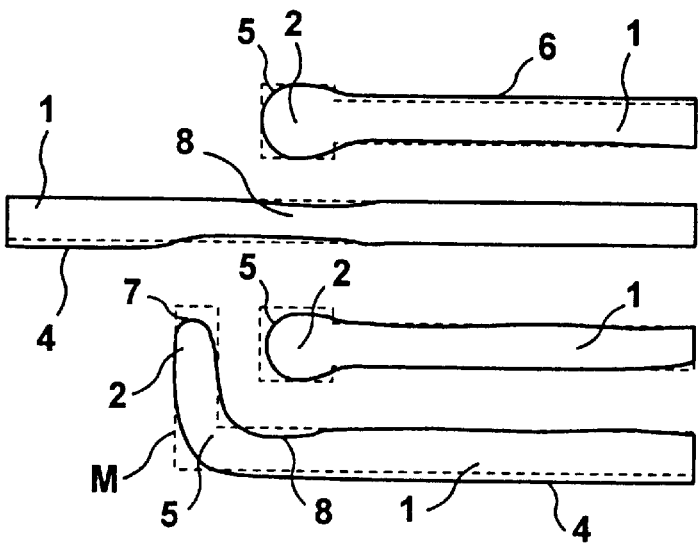
FIG. 2 is a diagrammatic plan view of a structure on a semiconductor wafer as it looks after having been produced using the etching mask.

Referring now to FIG. 2, there are shown the typically resulting structures made on the surface of a semiconductor wafer. Because of the lithography near the optical limit of resolution and the technological factors in the etching process (underetching, coating application), manifold deviations from the primary layout occur. The primary layout is represented by dashed lines. These deviations include roundings 5, especially of the corners; bulges 4; shortenings 7 of the ends of lines or tracks; proximity-dependent variations in the forms and widths of lines and tracks (also known as the isolated-nested effect), such as indentations 8 or shifts 6 that are jointly determined by the interstices 3.

The physical properties of the structures, created on the surface of the semiconductor wafer, in the form of the parasitic resistances and capacitances resulting from the structures themselves, will accordingly deviate sharply from calculated values on which the primary layout of FIG. 1 was based. Thus deviations will necessarily occur between the simulated performance of the integrated circuit that was calculated in advance and the actual performance of the integrated circuit. This can lead to delays in mass production, or cost-intensive corrections maybe required along with making the etching masks over again.

To increase the precision of simulation of the circuits that are actually produced later on, in the method of the invention the influence of technology is simulated in advance by applying a suitable algorithm to input data, which are in the form of a primary layout. In the method step in which the parasitic fault parameters, in the form of the parasitic impedances (parasitic extraction) are calculated, this primary layout altered by calculation is thus taken into account.

Figure 3:
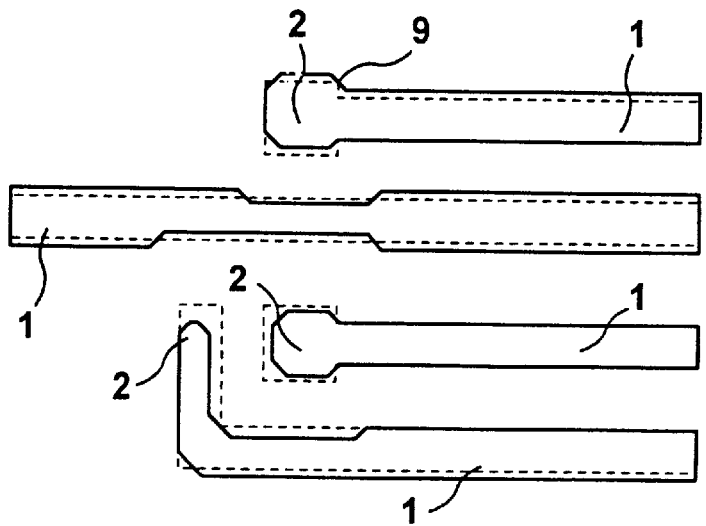
FIG. 3 is a similar plan view of a correction of the layout according to the invention, wherein the calculations of the parasitic fault parameters are performed correctly.

Referring now to FIG. 3, there is shown the outcome of a calculated layout based on the primary layout of FIG. 1. The extraction or calculation of the parasitic fault parameters is substantially more precise, because of the data processed as above, and leads to much better results for a primary layout corrected on the basis of the influences of the parasitic fault parameters. Curves and roundings that actually occur are approximated by means of sufficiently precise lines 9, whose angle can be set in advance (at 45°, for example). Time-consuming readjustments of the layouts and the attendant re-making of expensive etching masks are dispensed with, and the road to mass production is shortened.

I claim:

1. A method for producing structures on a surface of a semiconductor wafer, which comprises:

generating a primary layout of structures to be produced on a surface of a semiconductor wafer, in accordance with predetermined desired physical parameters of the structures;

correcting the primary layout based on production- or technology-dictated deviations to be expected in a following structuring step;

calculating parasitic fault parameters that would result from the semiconductor structures after a production thereof in accordance with the corrected primary layout;

correcting the primary layout in accordance with a result obtained in the step of calculating the parasitic fault parameters;

producing a mask based on the layout corrected in accordance with the parasitic fault parameters; and structuring the surface of the semiconductor wafer in an etching process subject to the production- or technology-dictated deviations from the shapes produced on the mask based on the primary layout.

2. The method according to claim 1, which comprises defining the parasitic fault parameters as parasitic impedances formed by a shape and a relative position of the structures on the semiconductor material.

3. The method according to claim 1, which comprises defining the production- or technology-dictated deviations of the structures as deviations due to effects selected from the group consisting of proximity effects of the conductor tracks, changes in shape in structural dimensions dictated by etching factors, optical effects, and effects of exposure to light.

4. The method according to claim 1, which comprises defining the production- or technology-dictated deviations of the structures as deviations due to resolution effects from proximity and miniaturization of the structures.

* * * * *